United States Patent
Han

(10) Patent No.: US 6,545,302 B2
(45) Date of Patent: Apr. 8, 2003

(54) IMAGE SENSOR CAPABLE OF DECREASING LEAKAGE CURRENT BETWEEN DIODES AND METHOD FOR FABRICATING THE SAME

(75) Inventor: Jin-Su Han, Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/812,212

(22) Filed: Mar. 19, 2001

(65) Prior Publication Data

US 2002/0024067 A1 Feb. 28, 2002

(30) Foreign Application Priority Data

Aug. 31, 2000 (KR) .................................... 2000-51300

(51) Int. Cl.[7] ............................................. H01L 27/148
(52) U.S. Cl. .................. 257/222; 257/215; 257/222; 257/225; 257/227; 257/228; 257/232; 257/233; 257/219; 257/249; 257/244; 257/292; 257/301; 257/302; 257/303; 257/304; 257/305; 257/461; 257/466; 257/514; 257/515; 438/48
(58) Field of Search ................... 257/222, 215, 257/225, 219, 227, 228, 233, 499, 501, 301, 302, 304, 305, 466, 514, 515, 232, 244, 249, 292, 461; 438/48

(56) References Cited

U.S. PATENT DOCUMENTS

| | | | | |
|---|---|---|---|---|
| 4,733,286 A | * | 3/1988 | Matsumoto | 357/30 |
| 5,029,321 A | * | 7/1991 | Kimura | 357/24 |
| 5,225,698 A | * | 7/1993 | Kim et al. | 257/303 |
| 5,321,334 A | * | 6/1994 | Kinoshita et al. | 313/366 |
| 5,455,192 A | * | 10/1995 | Jeon | 437/52 |
| 5,994,751 A | * | 11/1999 | Oppermann | 257/446 |
| 6,177,333 B1 | * | 1/2001 | Rhodes | 438/433 |
| 6,232,626 B1 | * | 5/2001 | Rhodes | 257/292 |
| 6,258,636 B1 | * | 7/2001 | Johnson et al. | 438/149 |
| 6,329,679 B1 | * | 12/2001 | Park | 257/292 |

\* cited by examiner

*Primary Examiner*—Eddie Lee
*Assistant Examiner*—Edgardo Ortiz
(74) *Attorney, Agent, or Firm*—Marshall, Gerstein & Borun

(57) ABSTRACT

An image sensor capable of preventing the degradation of pinned photodiodes and the generation of leakage current between neighboring pinned photodiodes is provided. The disclosed image sensor contains a plurality of pixel units, each pixel unit having a photodiode region. The image sensor includes a semiconductor substrate of a first conductivity type; a device isolation layer formed in the semiconductor substrate; a field stop layer formed beneath the device isolation layer; a trench formed in the semiconductor substrate, wherein the trench surrounds the photodiode region; a first doping region of the first conductivity type formed beneath the surface of the semiconductor substrate and beneath the surfaces of the trench; an insulating member filling the trench; and a second doping region of a second conductivity type formed in the semiconductor substrate under the first doping region.

10 Claims, 6 Drawing Sheets

IMAGE SENSOR CAPABLE OF DECREASING LEAKAGE CURRENT BETWEEN DIODES AND METHOD FOR FABRICATING THE SAME

FIELD OF THE INVENTION

The present invention relates generally to an image sensor, and, more particularly, to a CMOS image sensor and/or a charge coupled device (CCD), which is capable of decreasing leakage current between photodiodes and a method for fabricating the same.

BACKGROUND OF THE INVENTION

As is well known, an image sensor is an apparatus for sensing light reflected from an object and for generating image data. In particular, an image sensor fabricated by using CMOS (Complementary Metal Oxide Semiconductor) technology is called a CMOS image sensor.

Generally, the CMOS image sensor includes a plurality of pixel units having a light sensing region and a peripheral circuit region. Each of the pixel units also includes a light sensing element formed on the light sensing region and a plurality of transistors formed on the peripheral circuit region. The light sensing elements, such as a pinned photodiode, senses incident light reflected from an object and accumulates photoelectric charges that are generated due to the incident light. The transistors control the transfer of the photoelectric charges.

A prior art method for fabricating a photodiode region of a conventional image sensor will be described with reference to FIGS. 1A and 1B.

As shown in FIG. 1A, field oxide layers 102 for isolating devices are formed in a p-type silicon substrate 101. The field oxide layers 102 are formed by a LOCOS (Local Oxidation of Silicon) or an STI (Shallow Trench Isolation) method. Thereafter, P-type field stop layers 103 are formed beneath the field oxide layers 102 to prevent the generation of leakage current between devices.

As shown in FIG. 1B, after forming an ion implantation mask (not shown) to open the photodiode regions 3a and 3b on the p-type silicon substrate 101, a low-concentration and high-energy ion implantation is performed to form n-type doping regions 104 in the p-type silicon substrate 101. Thereafter, a high-concentration and low-energy ion implantation is performed to form p-type doping regions 105 beneath the surfaces of the p-type silicon substrate 101. After that, a thermal treatment process is performed to diffuse the impurities in the n-type doping regions 104 and the p-type doping regions 105, whereby pinned photodiodes are formed. Each pinned photodiode includes a p-type doping region 105, an n-type doping region 104 under the p-type doping region 105 and the p-type substrate 101 under the n-type doping region 104.

The pinned photodiode has several merits in comparison with a source/drain PN junction type diode and a MOS capacitor type diode. For example, the n-type doping region of the pinned photodiode having a PNP structure can be fully depleted and the depth of the depletion layer can be increased. Thereby, an incident photon can easily generate an electron. That is, the quantum efficiency and the light sensitivity of the pinned photodiode is improved relative to the aforementioned diodes.

A major shortcoming of the conventional CMOS image sensor is the generation of leakage current (LKG) between pinned photodiodes formed in adjacent pixel units. Although the field stop layers 103 are formed beneath the field oxide layers 102, the generation of the leakage current (LKG) cannot be prevented effectively because of the doping regions 104 formed by the high-energy ion implantation.

If the doping concentration of the field stop layers 103 is increased to prevent the generation of the leakage current, then the impurities in the field stop layers 103 are diffused to the photodiodes. As a result, the characteristics of the photodiodes are deteriorated.

SUMMARY OF THE INVENTION

In accordance with an aspect of the invention, an image sensor is provided which contains a first pixel unit and a second pixel unit, each of the first and second pixel units having a photodiode region. The image sensor includes a semiconductor substrate of a first conductivity type; a device isolation layer formed in the semiconductor substrate; a field stop layer formed beneath the device isolation layer; a trench formed in the semiconductor substrate between the photodiode region of the first pixel unit and the photodiode region of the second pixel unit; a first doping region of the first conductivity type formed beneath the surface of the semiconductor substrate of the first photodiode region of the first pixel unit; an insulating member within the trench; and a second doping region of a second conductivity type formed in the semiconductor substrate under the first doping region.

In accordance with another aspect of the invention, an image sensor is provided which contains a first pixel unit and a second pixel unit, each of the first and second pixel units having a photodiode region. The image sensor includes: a semiconductor substrate of a first conductivity type; a device isolation layer formed in the semiconductor substrate; a field stop layer formed beneath the device isolation layer; a trench formed in the semiconductor substrate between the photodiode region of the first pixel unit and the photodiode region of the second pixel unit; an insulating layer covering a surface of the field oxide layer and a surface of the semiconductor substrate including a surface of the trench; a conducting member within the trench, wherein the conducting member covers the device isolation layer and exposes the semiconductor substrate of the photodiode region of the first pixel unit; a first doping region of the first conductivity type formed beneath the surface of the semiconductor substrate of the photodiode region of the first pixel unit; and a second doping region of a second conductivity type formed in the semiconductor substrate under the first doping region.

In accordance with another aspect of the invention, a method for fabricating an image sensor having a first pixel unit and a second pixel unit is provided, each of the first and second pixel units having a photodiode region, the method comprising the steps of: providing a semiconductor substrate of a first conductivity type; forming a device isolation layer in the semiconductor substrate; forming a field stop layer beneath the device isolation layer; forming a trench in the semiconductor substrate between the photodiode region of the first pixel unit and the photodiode region of the second pixel unit; forming a first doping region of the first conductivity type beneath the surface of the semiconductor substrate of the photodiode region of the first pixel unit; forming an insulating member within the trench; forming a second doping region of a second conductivity type in the semiconductor substrate under the first doping region; and performing a thermal treatment process to diffuse impurities in the first doping region and the second doping region.

In accordance with still another aspect of the invention, a method for fabricating an image sensor having a first pixel unit and a second pixel unit is provided, wherein each of the first and second pixel units has a photodiode region, the method comprising the steps of: providing a semiconductor substrate of a first conductivity type; forming a device isolation layer in the semiconductor substrate; forming a field stop layer beneath the device isolation layer; forming a trench in the semiconductor substrate between the photodiode region of the first pixel unit and the photodiode region of the second pixel unit; forming an insulating layer on a surface of the device isolation layer and on a surface of the semiconductor substrate including on a surface of the trench; forming a conducting member within the trench and covering the insulating layer formed on the device isolation layer; forming a first doping region of the first conductivity type beneath the surface of the semiconductor substrate in the photodiode region of the first pixel unit; forming a second doping region of a second conductivity type in the semiconductor substrate under the first doping region; and performing a thermal treatment process to diffuse impurities in the first doping region and the second doping region.

BRIEF DESCRIPTION OF THE DRAWINGS

Exemplary devices and methods will now be described with reference to the accompanying drawings, wherein.

DETAILED DESCRIPTION OF THE PREFERRED EMBODIMENTS

A method for fabricating a photodiode region of a CMOS image sensor or a CCD will be described with reference to FIGS. 2A to 2E.

Figure 1A:
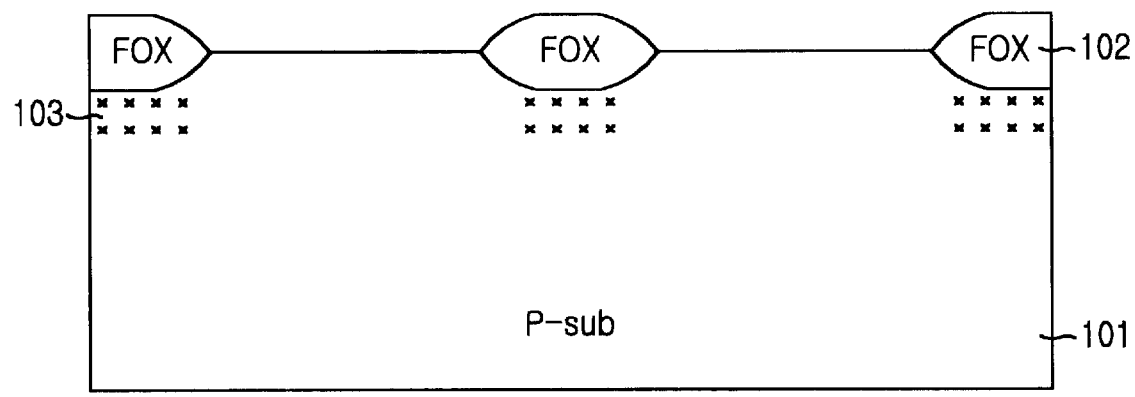
FIGS. 1A and 1B are cross-sectional views showing sequential steps for fabricating a conventional image sensor.
Figure 1B:
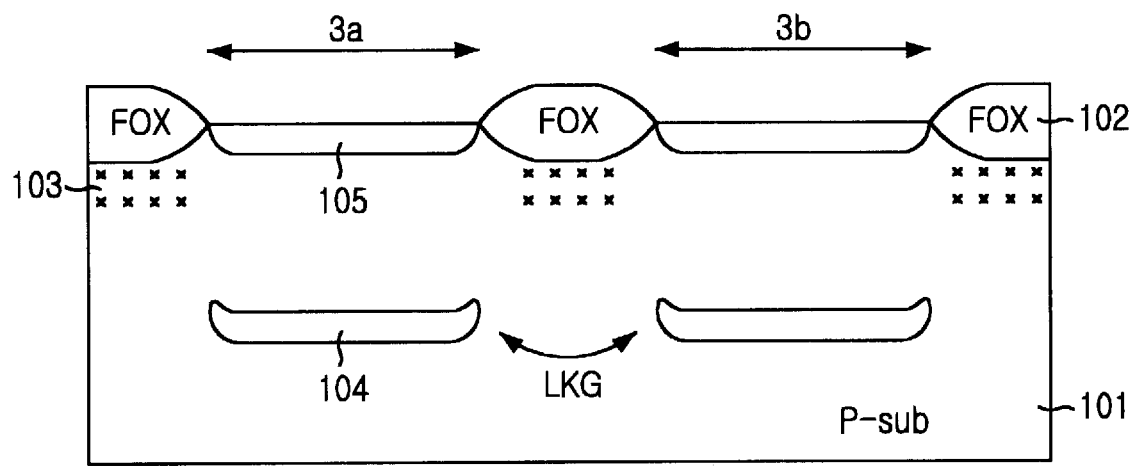
Figure 2A:
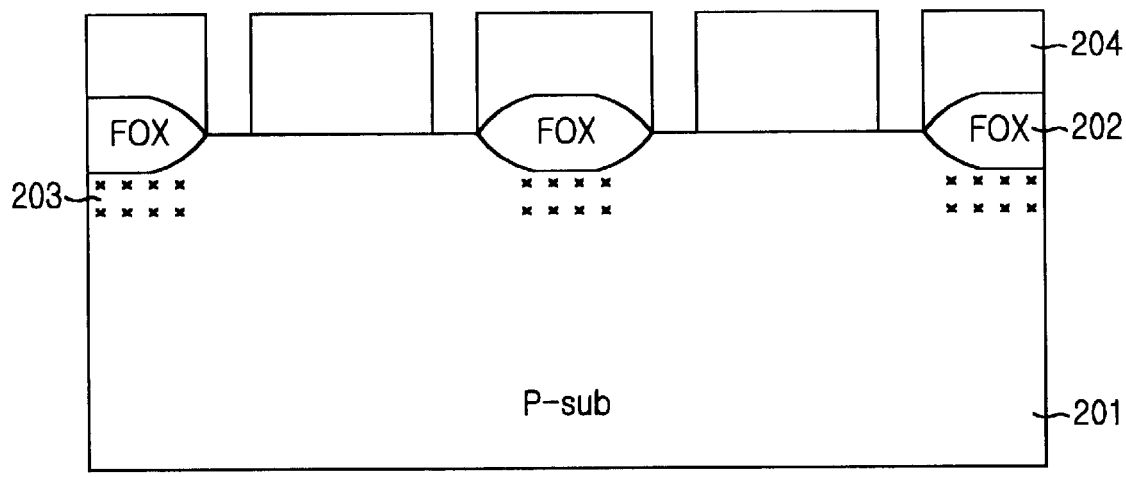
FIGS. 2A to 2E are cross-sectional views showing sequential steps for fabricating an image sensor in accordance with a first disclosed method.

As shown in FIG. 2A, field oxide layers 202 for isolating devices are formed in a p-type silicon substrate 201. P-type field stop layers 203 are formed beneath the field oxide layers 202 to prevent the leakage current from being generated between devices. The field oxide layers 202 are formed by the LOCOS (Local Oxidation of Silicon) or the STI (Shallow Trench Isolation) method. Thereafter, mask patterns 204 are formed on the silicon substrate 201. The mask patterns 204 expose the silicon substrate at the boundary regions between the field oxide layers 202 and the photodiode regions.

Figure 2B:
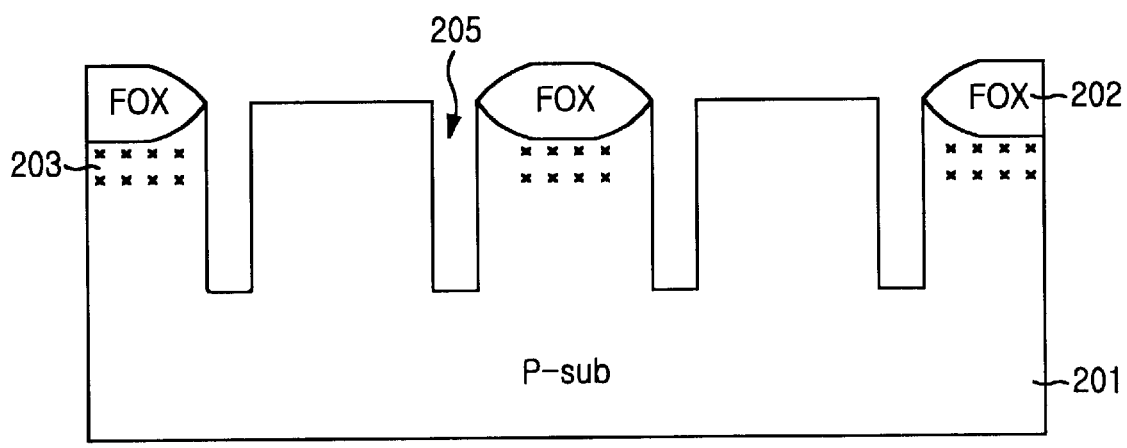
Figure 4:
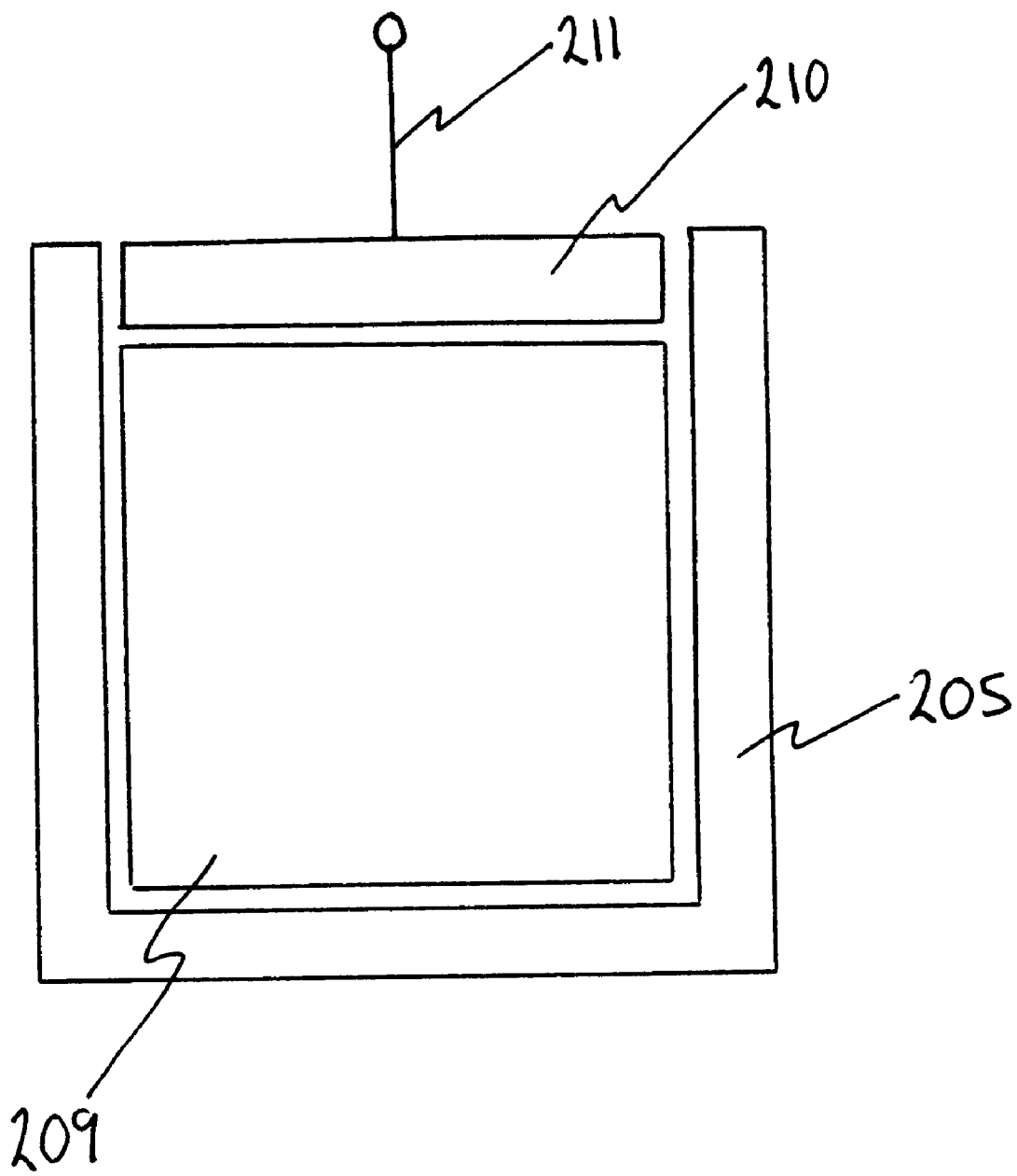
FIG. 4 is an elevated view showing an image sensor with a transistor in accordance with a disclosed embodiment.

As shown in FIG. 2B, an etching process is performed to form trenches 205 in the silicon substrate 201 by using the mask patterns 204 as etch barriers. The trenches 205 surround the pinned photodiode regions. However, it is desirable that at least one side of the pixel unit 209 be left open for connection to a gate electrode 210, which may be a transistor or other suitable device. Therefore, the trenches 205 surround the pinned photodiode regions to the extent necessary to separate the region from adjacent photodiode regions while premitting access to the region via a gate electrode 210 or other device, as shown in FIG. 4. The depth of the trench is deeper than that of the pinned photodiodes. That is, the bottoms of the trenches 205 are deeper than the bottoms of the n-type doping regions 208, which are formed as described below.

Figure 2C:
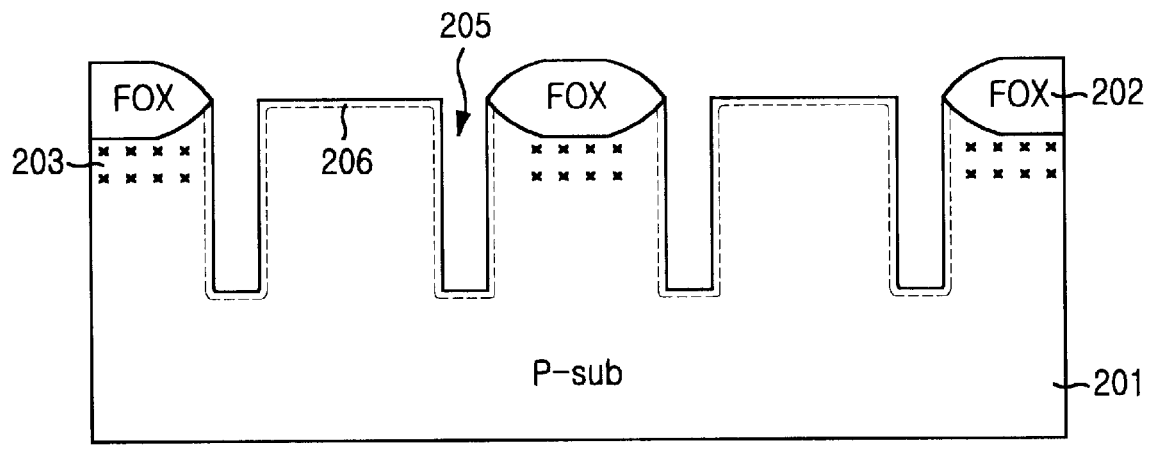

As shown in FIG. 2C, after removing the mask patterns 204, a high-concentration and low-energy ion implantation is performed to form p-type doping regions 206. The p-type doping regions 206 are formed beneath the surface of the silicon substrate 201 including the surfaces of the trenches 205, thereby preventing generation of leakage current between the pinned photodiodes.

Figure 2D:
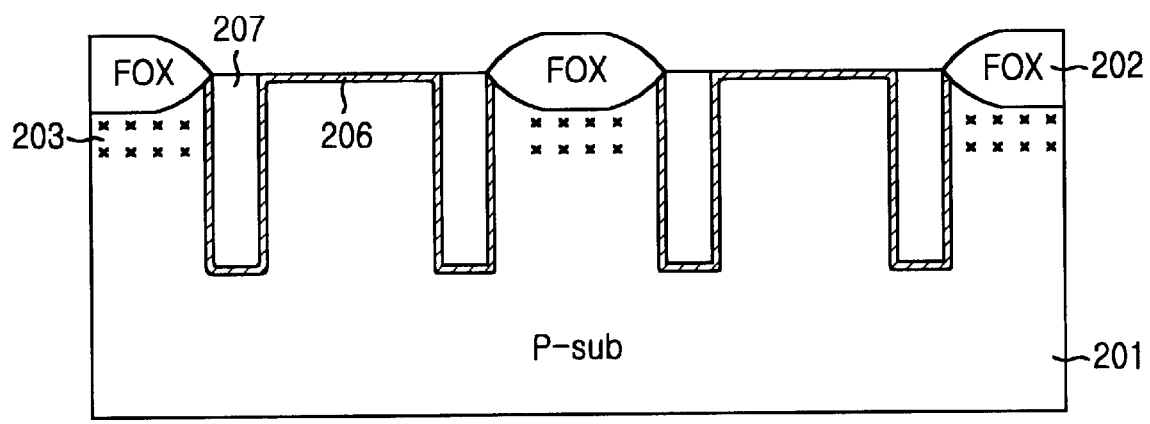

As shown in FIG. 2D, the trenches 205 are filled with an insulating member 207.

Figure 2E:
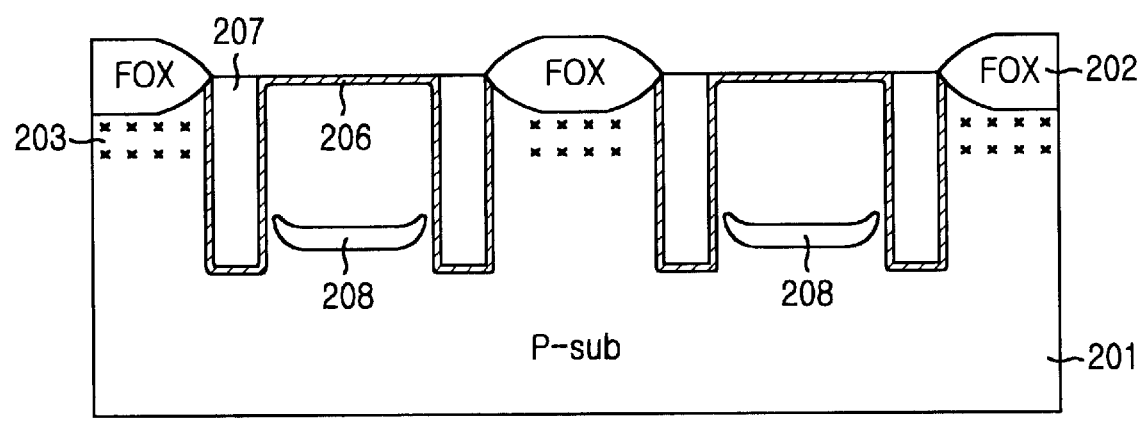

As shown in FIG. 2E, a low-concentration and high-energy ion implantation is performed to form n-type doping regions 208 in the silicon substrate 201 between the trenches 205. After that, a thermal treatment process is performed to diffuse the impurities, thereby forming the pinned photodiodes. Each pinned photodiode includes the p-type doping region 206, the n-type doping region 208 under the p-type doping region 206, and the p-type substrate 201 under the n-type doping region 208.

The image sensor shown in FIG. 2E includes an insulating member 207 at the boundaries of the field oxide layers 202 and the pinned photodiodes. Therefore, the insulating member 207 prevents leakage current from being generated between neighboring pinned photodiodes, even though the doping concentration of the field stop layers 203 are low and the depth of the field stop layers 203 are narrow.

Another method for fabricating a photodiode region of a CMOS image sensor will now be described with reference to FIGS. 3A and 3B.

Figure 3A:
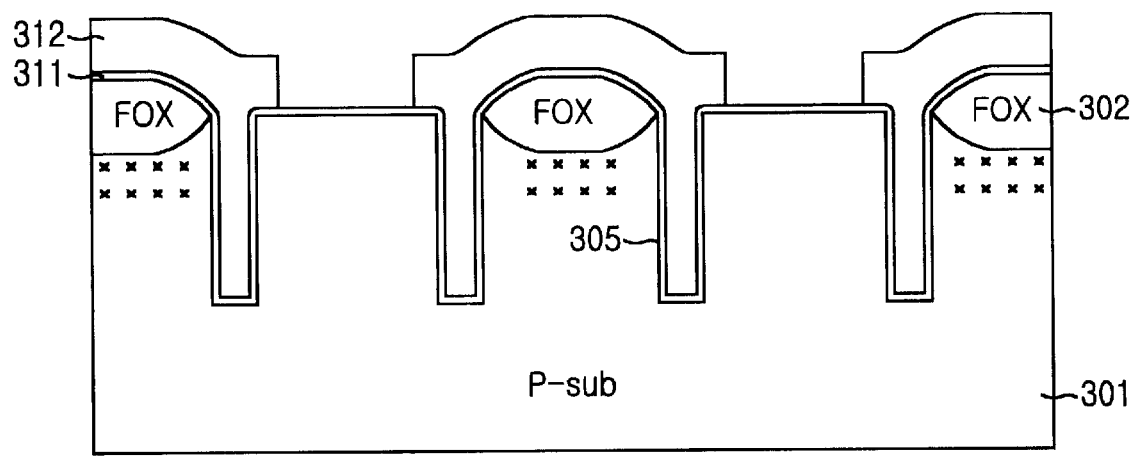
FIGS. 3A and 3B are cross-sectional views showing sequential steps for fabricating an image sensor in accordance with a second disclosed method.

As shown in FIG. 3A, field oxide layers 302 for isolating devices are formed in a p-type silicon substrate 301. P-type field stop layers 303 are formed beneath the field oxide layers 302 to prevent leakage current from being generated between devices. The field oxide layers 302 are formed by the LOCOS (Local Oxidation of Silicon) or the STI (Shallow Trench Isolation) method. The silicon substrate 301 is then selectively etched to form trenches 305 at boundary regions between the field oxide layers 302 and photodiode regions as described above. The trenches 305 surround the pinned photo diode regions. As above, the trenches 305 surround the photodiode regions to the extent necessary to separate adjacent pinned photodiode regions of interest yet allow for a connection to a gate electrode 210 or other device. Thereafter, an insulating layer 311 is formed on the field oxide layers 302 and the silicon substrate 301 including the surfaces of the trenches 305. After that, conducting members 312 are formed to fill the trenches 305 and to cover the field oxide layers 302. The part of the insulating layer 311 covering the pinned photo diode region is exposed after forming the conducting member 312 using suitable methods known in the art.

Figure 3B:
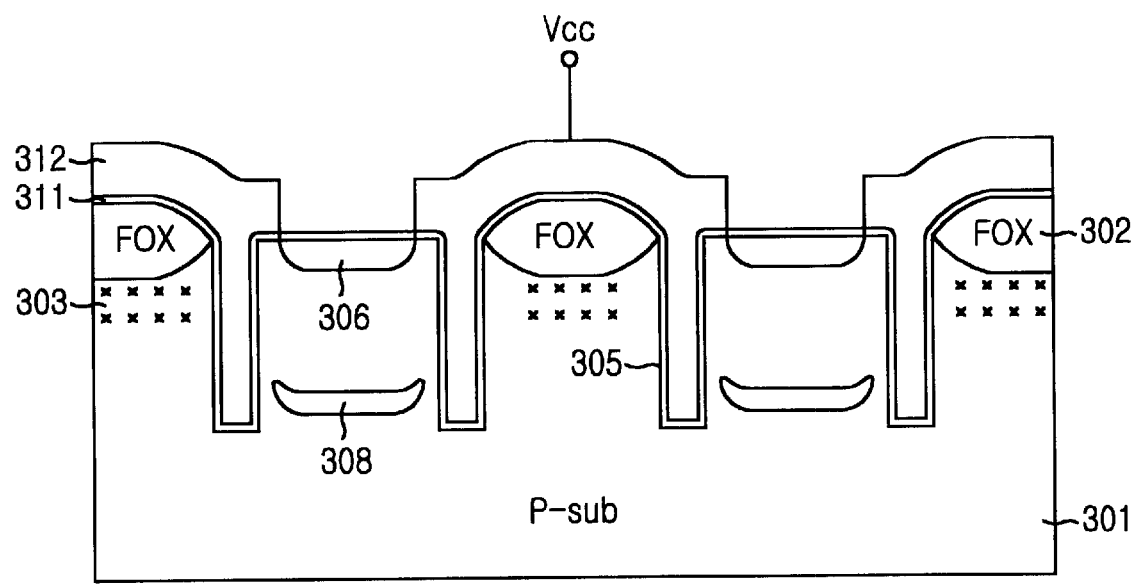

As shown in FIG. 3B, a high-concentration and low-energy ion implantation is performed to form p-type doping regions 306. The p-type doping regions 306 are formed beneath the surface of the silicon substrate 301 between the trenches 305.

Thereafter, a low-concentration and high-energy ion implantation is performed to form n-type doping regions 308 in the silicon substrate 301 between the trenches 305. After that, a thermal treatment process is performed to diffuse the impurities, and thereby form pinned photodiodes.

A gate electrode 210 is formed on the conducting member 312 covering the field oxide layer 302. Power supply lines 211 connected to the gate electrode 210 are formed to supply power to the conducting member 312 through the gate electrode 210.

The image sensor shown in FIG. 3B is capable of preventing leakage current from being generated between photodiodes, thereby increasing the capacitance and the quantum efficiency of the pinned photodiodes. Furthermore, it is possible to alter the characteristics of the photodiode independently. As a result, the process margin can be increased.

From the foregoing, persons of ordinary skill in the art will appreciate that image sensors and methods for fabricating the same have been provided. The disclosed sensors are capable of preventing the degradation of the pinned photodiodes and the generation of leakage current between neighboring pinned photodiodes.

Although preferred examples have been disclosed for illustrative purposes, those of ordinary skill in the art will appreciate that the scope of this patent is not limited thereto. On the contrary, this patent covers all apparatus and methods falling within the scope and spirit of the accompanying claims.

What is claimed is:

1. An image sensor containing a first pixel unit and a second pixel unit, each of the first and second pixel units having a photodiode region, the image sensor comprising:
   a semiconductor substrate of a first conductivity type;
   a device isolation layer fanned in the semiconductor substrate;
   a field stop layer formed beneath the device isolation layer;
   a trench formed in the semiconductor substrate between the photodiode region of the first pixel unit and the photodiode region of the second pixel unit, the trench having a sidewall and a bottom;
   a first doping region of the first conductivity type formed beneath a surface of the semiconductor substrate of the photodiode region of the first pixel unit and beneath surfaces of the sidewall and bottom of the trench;
   an insulating member within the trench; and
   a second doping region of a second conductivity type formed in the semiconductor substrate under the first doping region.

2. The image sensor of claim 1, wherein the insulating member fills the trench.

3. The image sensor of claim 1, wherein the first doping region is further formed beneath the surface of the trench.

4. The image sensor of claim 1, wherein the trench has a bottom and the bottom of the trench is deeper than the second doping region.

5. The image sensor of claim 1, wherein the trench comprises a plurality of trenches and the plurality of trenches substantially surround the first pixel unit.

6. An image sensor containing a first pixel unit and a second pixel unit, each of the first and second pixel units having a photodiode region, the image sensor comprising;
   a semiconductor substrate of a first conductivity type;
   a device isolation layer formed in the semiconductor substrate;
   a field stop layer formed beneath the device isolation layer;
   a trench formed in the semiconductor substrate between the photodiode region of the first pixel unit and the photodiode region of the second pixel unit;
   an insulating layer contacting a surface of the device isolation layer, a surface of the semiconductor substrate between the photodiode region of the first pixel unit and the photodiode region of the second pixel unit, and contacting surfaces of the trench;
   a conducting member within the trench, wherein the conducting member covers the device isolation layer and exposes the semiconductor substrate of the photodiode region of the first pixel unit;
   a first doping region of the first conductivity type formed beneath the surface of the semiconductor substrate of the photodiode region of the first pixel unit; and
   a second doping region of a second conductivity type formed in the semiconductor substrate under the first doping region.

7. The image sensor of claim 6, wherein the conducting member fills the trench.

8. The image sensor of claim 6, wherein the trench comprises a plurality of trenches and the plurality of trenches substantially surround the first pixel unit.

9. The image sensor of claim 6, further comprising a gate electrode disposed on a portion of the conducting member covering the device isolation layer.

10. The image sensor of claim 9, further comprising a power supply line for applying power to the conducting layer through the gate electrode.

* * * * *

UNITED STATES PATENT AND TRADEMARK OFFICE
CERTIFICATE OF CORRECTION

PATENT NO. : 6,545,302 B2  Page 1 of 1
DATED : April 8, 2003
INVENTOR(S) : Jin-Su Han It is certified that error appears in the above-identified patent and that said Letters Patent is hereby corrected as shown below:

Column 5,
Line 24, please delete "fanned" and insert -- formed --.

Signed and Sealed this

Seventh Day of October, 2003

JAMES E. ROGAN
*Director of the United States Patent and Trademark Office*